(12) United States Patent
Han et al.

(10) Patent No.: US 11,398,529 B2
(45) Date of Patent: Jul. 26, 2022

(54) DISPLAY PANEL AND MANUFACTURING METHOD THEREOF

(71) Applicant: Shenzhen China Star Optoelectronics Semiconductor Display Technology Co., Ltd., Shenzhen (CN)

(72) Inventors: Zhibin Han, Shenzhen (CN); Baixiang Han, Shenzhen (CN); Jianxin Liu, Shenzhen (CN); Liuqi Zhang, Shenzhen (CN); Kuo Gao, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 178 days.

(21) Appl. No.: 16/759,397

(22) PCT Filed: Mar. 27, 2020

(86) PCT No.: PCT/CN2020/081744
§ 371 (c)(1),
(2) Date: Apr. 27, 2020

(87) PCT Pub. No.: WO2021/168979
PCT Pub. Date: Sep. 2, 2021

(65) Prior Publication Data
US 2022/0045138 A1  Feb. 10, 2022

(30) Foreign Application Priority Data

Feb. 26, 2020 (CN) .......................... 202010120823.3

(51) Int. Cl.
*H01L 27/32* (2006.01)
*H01L 51/56* (2006.01)
*H01L 51/52* (2006.01)

(52) U.S. Cl.
CPC ...... *H01L 27/3218* (2013.01); *H01L 27/3246* (2013.01); *H01L 51/5237* (2013.01); *H01L 51/56* (2013.01); *H01L 2227/323* (2013.01)

(58) Field of Classification Search
CPC ............. H01L 27/3218; H01L 27/3246; H01L 2227/323
See application file for complete search history.

(56) References Cited

U.S. PATENT DOCUMENTS

2020/0343319 A1* 10/2020 Matsueda ........... H01L 27/3276

* cited by examiner

*Primary Examiner* — Fernando L Toledo
*Assistant Examiner* — Valerie N Newton

(57) ABSTRACT

A display panel and a manufacturing method thereof, the display panel includes a first sub-pixel strip, a second sub-pixel strip, and a third sub-pixel strip arranged in a row direction or a column direction. The sub-pixels on each sub-pixel strip of the present disclosure have the same color and are arranged in series. The first sub-pixels on the first sub-pixel strip and the second sub-pixels on the second sub-pixel strip are staggered to improve flatness of printing the luminous material and luminous uniformity of OLED devices.

12 Claims, 4 Drawing Sheets

S1 — a pixel definition layer is provided on a base substrate, and patterning the pixel definition layer to form at least two first sub-pixel holes, at least two second sub-pixel holes, and at least two third sub-pixels which are sequentially arranged in a row/column direction, and forming a first luminescent material confluence channel communicating with two adjacent first sub-pixel holes and forming a second luminescent material confluence channel communicating with two adjacent second sub-pixel holes along the row/column S2 — sequentially arranging a plurality of nozzles in the row/column direction with the at least two first sub-pixel holes, the at least two second sub-pixel holes, and the at least two third sub-pixel holes, and forming a luminescent material in a row/column linear manner including forming a first luminescent material in the at least two first sub-pixel holes and the first luminescent material confluence channel, forming a second luminescent material in the at least two second sub-pixel holes and the second luminescent material confluence channel, and forming a third luminescent material in the at least two third sub-pixel holes S3 — forming a cathode layer on the luminescent material S4 — forming a thin-film encapsulation layer on the cathode layer

FIG. 5

DISPLAY PANEL AND MANUFACTURING METHOD THEREOF

RELATED APPLICATIONS

This application is a National Phase of PCT Patent Application No. PCT/CN2020/081744 having International filing date of Mar. 27, 2020, which claims the benefit of priority of Chinese Patent Application No. 202010120823.3 filed on Feb. 26, 2020. The contents of the above applications are all incorporated by reference as if fully set forth herein in their entirety.

FIELD AND BACKGROUND OF THE INVENTION

The present disclosure relates to the field of display technologies, and more particularly, to a display panel and a manufacturing method thereof.

Organic light-emitting diode (OLED) displays have gradually become advanced displays to replace liquid crystal displays due to their advantages of ultra-high contrast, wide color gamut, fast response times, and active light emission. However, when designing a higher pixel density panel, it will be limited by the manufacturing process and OLED printing technology, and achieving high pixel density pixel design is also difficult. At present, OLED device manufacturing technology is divided into two types: vapor deposition and inkjet printing, and the OLED panel manufacturing process of inkjet printing technology is a feasible method to reduce production costs compared to the vapor deposition process. However, due to current equipment limitations and printing technology, there is usually a problem of poor flatness of the OLED luminescent material after printing, which in turn leads to poor luminescence uniformity of the OLED device.

Therefore, the current technology has defects and the defects needs to be improved urgently.

SUMMARY OF THE INVENTION

The present disclosure provides a display panel and a manufacturing method thereof, which can solve the problem that the flatness of the luminescent material after printing is poor, resulting in poor luminescence uniformity of the OLED device.

To solve the above problems, the technical solutions provided by the present disclosure are as follows:

The present disclosure provides a display panel, including:

a substrate;

an array driving layer disposed on the substrate;

a light-emitting device layer disposed on the array driving layer;

a thin-film encapsulation layer disposed on the light-emitting device layer; and the display panel comprises a first sub-pixel strip, a second sub-pixel strip, and a third sub-pixel strip sequentially arranged in a row direction or a column direction;

the first sub-pixel strip comprises at least two first sub-pixels connected to each other which distributed along a direction of the first sub-pixel strip, the second sub-pixel strip comprises at least two second sub-pixels connected to each other which distributed along a direction of the second sub-pixel strip, and the third sub-pixel strip comprises at least two third sub-pixels connected to each other distributed along a direction of the third sub-pixel strip;

wherein the first sub-pixels on the first sub-pixel strip and the second sub-pixels on the second sub-pixel strip are staggered, and one of the first sub-pixels and one of the third sub-pixels constitute a first pixel unit, one of the second sub-pixels and one of the third sub-pixels constitute a second pixel unit.

In the display panel of the present disclosure, wherein a pixel opening area of each of the first sub-pixels equal to a pixel opening area of each of the second sub-pixels, and a pixel opening area of each of the third sub-pixels is greater than the pixel opening area of each of the first sub-pixels or the pixel opening area of each of the second sub-pixels.

In the display panel of the present disclosure, wherein a pixel opening width of each of the first sub-pixels perpendicular to the direction of the first sub-pixel strip and a pixel opening width of each of the second sub-pixels perpendicular to the direction of the second sub-pixel strip are equal to each other, and are both less than a pixel opening width of the third sub-pixel perpendicular to the direction of third sub-pixel stripe.

In the display panel of the present disclosure, wherein a width of the display panel occupied by the first sub-pixel strip and the second sub-pixel strip staggered is less than sum of a width of the display panel occupied by the first sub-pixel strip and a width of the display panel occupied the second sub-pixel strip.

In the display panel of the present disclosure, wherein the first sub-pixel strip and the second sub-pixel strip respectively comprise a first luminescent material confluence channel and a second luminescent material confluence channel, adjacent two of the at least two first sub-pixels on the first sub-pixel strip are communicated with each other through the first luminescent material confluence channel, and adjacent two of the at least two second sub-pixels on the second sub-pixel strip are communicated with each other through the second luminescent material confluence channel.

In the display panel of the present disclosure, wherein in a direction perpendicular to the direction of the first sub-pixel strip, a width of the first luminescent material confluence channel is less than a pixel opening width of the first sub-pixel; and in a direction perpendicular to the direction of the second sub-pixel strip, a width of the second luminescent material confluence channel is less than a pixel opening width of the second sub-pixel.

In the display panel of the present disclosure, wherein a boundary of a side of the first sub-pixel strip near the second sub-pixel strip forms a first depression corresponding the first luminescent material confluence channel, a boundary of a side of the second sub-pixel strip near the first sub-pixel strip forms a second depression corresponding the second luminescent material confluence channel, each of the at least two first sub-pixel is provided corresponds to the second depression of the second sub-pixel strip, and each of the at least two second sub-pixel is provided corresponds to the first depression of the first sub-pixel strip.

In the display panel of the present disclosure, wherein the light-emitting device layer comprises a plurality of anodes, an orthographic projection of an anode of the first sub-pixel on the substrate spaced apart from an orthographic projection of the second luminescent material confluence channel of the second sub-pixel strip on the substrate, and an orthographic projection of the an anode of the second sub-pixel on the substrate spaced apart from an orthographic projection of the first luminescent material confluence channel of the first sub-pixel strip on the substrate.

In order to solve the above technical problems, the present disclosure also provides a method of manufacturing a display panel, wherein the method comprises the following steps:

step S1, a pixel definition layer is provided on a base substrate, and patterning the pixel definition layer to form at least two first sub-pixel holes, at least two second sub-pixel holes, and at least two third sub-pixels which are sequentially arranged in a row/column direction, and forming a first luminescent material confluence channel communicating with two adjacent first sub-pixel holes and forming a second luminescent material confluence channel communicating with two adjacent second sub-pixel holes along the row/column;

step S2, sequentially arranging a plurality of nozzles in the row/column direction with the at least two first sub-pixel holes, the at least two second sub-pixel holes, and the at least two third sub-pixel holes, and forming a luminescent material in a row/column linear manner including forming a first luminescent material in the at least two first sub-pixel holes and the first luminescent material confluence channel, forming a second luminescent material in the at least two second sub-pixel holes and the second luminescent material confluence channel, and forming a third luminescent material in the at least two third sub-pixel holes;

step S3: forming a cathode layer on the luminescent material; and step S4, forming a thin-film encapsulation layer on the cathode layer.

In the method of the present disclosure, wherein in the step S1, after patterning the pixel definition layer, forming a first depression in a boundary of a side of a combination of the first sub-pixel holes and the first luminescent material confluence channel near the second sub-pixel holes, forming a second depression in a boundary of a side of a combination of the second sub-pixel holes and the second luminescent material confluence channel near the first sub-pixel holes, wherein each of the first sub-pixel holes is provided corresponds to a position of the second depression, each of the second sub-pixel holes is provided corresponds to a position of the first depression.

In the method of the present disclosure, wherein sequentially arranging a plurality of nozzles in the row/column direction comprising a first group of nozzles corresponding the first sub-pixel holes or the second sub-pixel holes, and a second group of nozzles corresponding the first luminescent material confluence channel or the second luminescent material confluence channel.

In the method of the present disclosure, wherein when the printing range of the plurality of nozzles is larger than a width of the first luminescent material confluence channel and a width of the second luminescent material confluence channel, the step S2 comprises the following steps:

when the plurality of nozzles moves to the first luminescent material confluence channel, turning on the first group of nozzles and turning off the second group of nozzles, to form the first luminescent material in the at least two first sub-pixel holes and the first luminescent material confluence channel;

when the plurality of nozzles moves to the second luminescent material confluence channel, turning on the first group of nozzles and turning off the second group of nozzles, to form the second luminescent material in the at least two second sub-pixel holes and the second luminescent material confluence channel;

when the plurality of nozzles moves to the third sub-pixel holes, turning on the first group of nozzles and the second group of nozzles, to form the third luminescent material in the third sub-pixel holes.

In the method of the present disclosure, wherein the printing range of the plurality of nozzles is smaller than a width of the first luminescent material confluence channel and a width of the second luminescent material confluence channel, turning on all the nozzles of the first group of nozzles and the second group of nozzles in step S2.

The beneficial effects of the present disclosure: the display panel and the manufacturing method thereof provided by the present disclosure, arranging the sub-pixels of the same color along rows/columns, while achieving linear printing the luminescent material, due to the adjacent two sub-pixels are connected through the luminescent material confluence channel, therefore, the luminescent materials printed to different positions of the same sub-pixel strip can flow with each other, thereby improving the flatness of the luminescent material printing and the uniformity of the OLED device.

BRIEF DESCRIPTION OF THE SEVERAL VIEWS OF THE DRAWINGS

The technical solutions and other beneficial effects of the present disclosure will be obvious through the detailed description of the specific implementation of the present disclosure in conjunction with the accompanying figures.

FIG. 5 is a flowchart of a method of manufacturing the display panel of one embodiment of the present disclosure.

DESCRIPTION OF SPECIFIC EMBODIMENTS OF THE INVENTION

Figure 1:
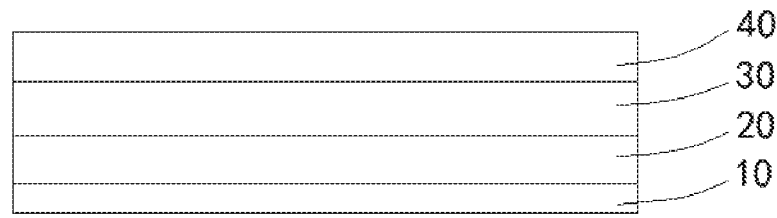
FIG. 1 is a schematic structural diagram of a display panel according one embodiment of the present disclosure.

In the following, the technical solutions in the embodiments of the present disclosure will be clearly and completely described with reference to the figures. Obviously, the described embodiments are only some embodiments of the present disclosure, not all the embodiments. Based on the embodiments in the present disclosure, all other embodiments obtained by a person of ordinary skill in the art without creative steps shall fall within the protection scope of the present disclosure.

In the description of the present disclosure, it should be understood that the terms of center, longitudinal, transverse, length, width, thickness, upper, lower, front, rear, left, right, vertical, horizontal, top, bottom, inside, outside, clockwise, counterclockwise, etc. or a positional relationship based on orientation or position shown in the figures are only for the convenience of describing the present disclosure and simplifying the description, rather than indicating or implying the device or element referred to must have a specific orientation, structure, or operation. Therefore, it cannot be understood as a limitation of the present disclosure. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the present disclosure, "I" means "or".

The present disclosure may repeat reference numerals and/or reference letters in different embodiment. Such repetition is for simplicity and clarity, and does not itself indicate the relationship between the various embodiments and/or settings discussed.

Referring to FIG. 1, the present disclosure provides a display panel, including a substrate 10, which may be a glass substrate or a flexible substrate; an array driving layer 20 disposed on the substrate 10, a light-emitting device layer 30 disposed on the array driving layer 20; and a thin film encapsulation layer 40 disposed on the light-emitting device layer 30.

The array driving layer 20 includes an inorganic stacked layer and driving components. Specifically, the inorganic stacked layer includes, but is not limited to, a buffer layer, a gate insulating layer, and an interlayer insulating layer sequentially disposed. The driving components include but are not limited to thin film transistors and capacitors.

An organic stacked layer and a light-emitting device layer 30 are further disposed on the inorganic stacked layer, and the organic stacked layer includes but is not limited to a planarization layer and a pixel definition layer disposed in a stack. The light-emitting device layer 30 includes an anode, a light-emitting material layer, and a cathode that are stacked. The thin-film encapsulation layer 40 includes at least three stacked inorganic layers and organic layers.

Figure 2:
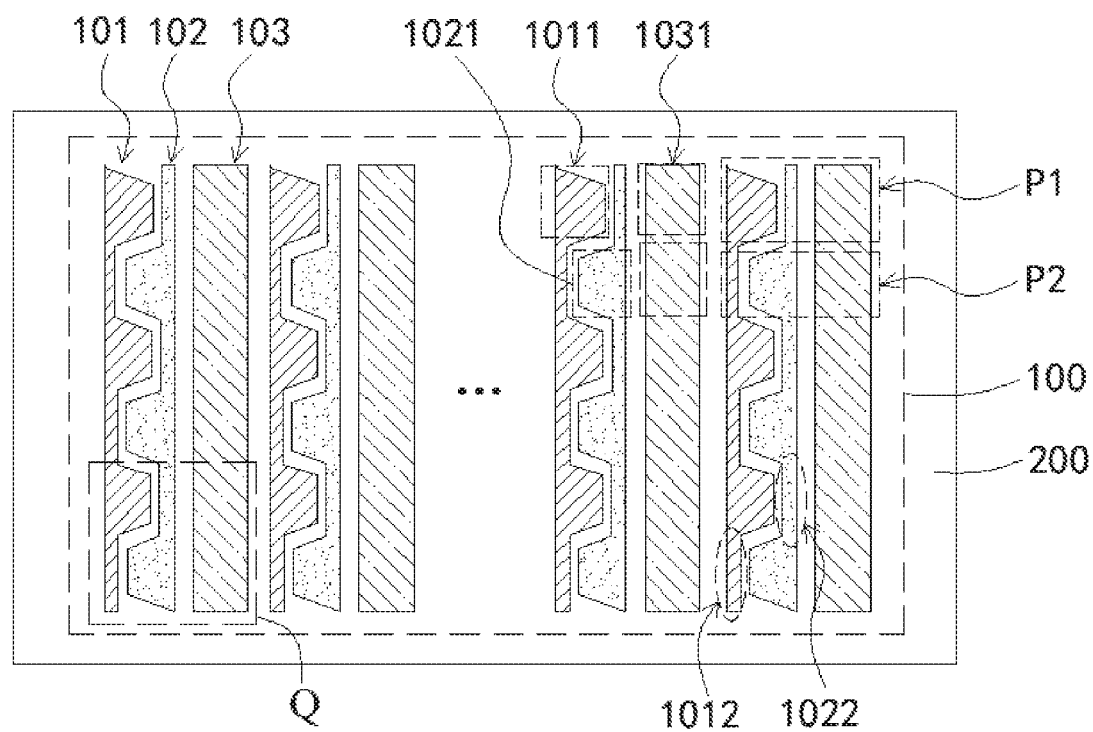
FIG. 2 is a top view of the display panel according to one embodiment of the present disclosure.

Referring to FIG. 2, the display panel includes a display area 100 and a non-display area 200, and the display area 100 includes a first sub-pixel strip 101, a second sub-pixel strip 102 and a third sub-pixel strip 103 sequentially arranged in a row direction or a column direction. The first sub-pixel strip 101, the second sub-pixel strip 102, and the third sub-pixel strip 103 are spaced apart.

The first sub-pixel strip 101 includes at least two first sub-pixels 1011 connected to each other which distributed along a direction of the first sub-pixel strip 101; the second sub-pixel strip 102 includes at least two second sub-pixels 1021 connected to each other which distributed along a direction of the second sub-pixel strip 102; the third sub-pixel bar 103 includes at least two third sub-pixels 1031 connected to each other distributed along a direction of the third sub-pixel strip 103. Colors of the first sub-pixels 1011 on each of the first sub-pixel strips 101 are the same, for example, red; color of the second sub-pixels 1021 on each of the second sub-pixel strips 102 are the same, for example, blue; colors of the third sub-pixels 1031 on each of the third sub-pixel strips 103 are the same, for example, green.

The first sub-pixels 1011 on the first sub-pixel strip 101 and the second sub-pixels 1021 on the second sub-pixel strip 102 are staggered, and one of the first sub-pixels 1011 and one of the adjacent third sub-pixels 1031 constitutes a first pixel unit P1; one of the second sub-pixels 1021 and one of the adjacent third sub-pixels 1031 constitute a second pixel unit P2.

The first pixel unit P1 and the second pixel unit P2 are the smallest repeating pixel units. In this embodiment, the first pixel units P1 and the second pixel units P2 are alternately arranged in the direction (i.e., column direction) along the sub-pixel strip. The first pixel units P1 are arranged repeatedly at intervals in the direction (i. e., row direction) perpendicular to the direction of the sub-pixel strip; the second pixel unit P2 are arranged repeatedly at intervals in the direction (i. e., row direction) perpendicular to the direction of the sub-pixel strip.

The first pixel unit P1 and the second pixel unit P2 cooperate to emit light formed by the combination of the first subpixel 1011, the second subpixel 1021, and the third subpixel 1031. For example, during the light emission process of the display panel, if the first pixel unit P1 (red sub-pixel and green sub-pixel) needs to emit light composed of the second sub-pixel 1021 (blue sub-pixel), it is necessary to combine the light emitted by adjacent second sub-pixel 1021 of the second pixel unit P2. If the second pixel unit P2 (blue sub-pixel and green sub-pixel) needs to emit light with the first sub-pixel 1011 (red sub-pixel), it is necessary to combine the light emitted by adjacent first sub-pixel 1011. This design can achieve high pixel density display with limited process capability.

Specifically, the first sub-pixel strip 101 and the second sub-pixel strip 102 respectively include a first luminescent material confluence channel 1012 and a second luminescent material confluence channel 1022. Adjacent two of the at least two first sub-pixels 1011 on the first sub-pixel strip 101 communicate with each other through the first luminescent material confluence channel 1012, that is, the luminescent materials of the two adjacent first sub-pixels 1011 can flow to each other by the first luminescent material confluence channel 1012. Adjacent two of the at least two second sub-pixels 1021 on the second sub-pixel strip 102 are communicated with each other through the second luminescent material confluence channel 1022, that is, the luminescent materials of the two adjacent second sub-pixels 1021 can flow to each other by the second luminescent material confluence channel 1022.

Adjacent two of the at least two third sub-pixels 1031 on the third sub-pixel strip 103 can be directly connected/conducted, so that luminescent materials at different positions on the third sub-pixel strip 103 can flow, while achieving maximized pixel opening of the third sub-pixel strip 103.

In the present disclosure, since the luminescent materials in the same color and different positions will flow to each other, thereby improving the flatness of printing the luminescent material and the luminous uniformity of the OLED device.

Figure 3:
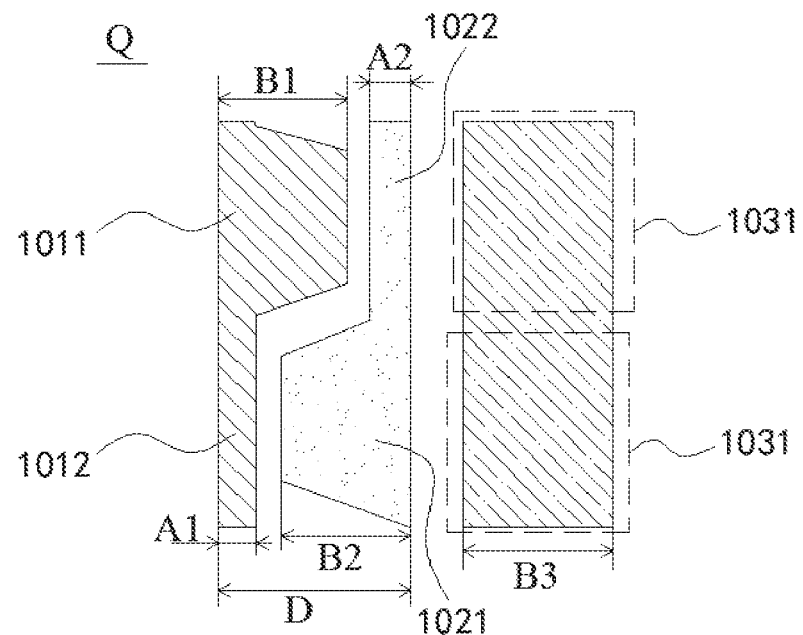
FIG. 3 is an enlarged figure of the Q region of FIG. 2.

Referring to FIG. 3, wherein in a direction perpendicular to the direction of the first sub-pixel strip 101, a width A1 of the first luminescent material confluence channel 1012 is less than a pixel opening width B1 of the first sub-pixel 1011. In a direction perpendicular to the direction of the second sub-pixel strip 102, a width A2 of the second luminescent material confluence channel 1022 is less than a pixel opening width B2 of the second sub-pixel 1021.

In one embodiment, a width A1 of the first luminescent material confluence channel 1012 is equal to a width A2 of the second luminescent material confluence channel 1022.

In one embodiment, a pixel opening area of each of the first sub-pixels 1011 equal to a pixel opening area of each of the second sub-pixels 1021, and a pixel opening area of each of the third sub-pixels 1031 is larger than the pixel opening area of each of the first sub-pixels 1011 or the pixel opening area of each of the second sub-pixels 1021.

Further, a pixel opening width B1 of each of the first sub-pixels 1011 perpendicular to the direction of the first sub-pixel strip 101 and a pixel opening width B2 of each of the second sub-pixels 1021 perpendicular to the direction of the second sub-pixel strip 102 are equal to each other, and are both less than a pixel opening width B3 of the third sub-pixel 1031 perpendicular to the direction of third sub-pixel stripe 103.

In one embodiment, a boundary of a side of the first sub-pixel strip 101 near the second sub-pixel strip 102 forms a first depression corresponding the first luminescent material confluence channel 1012, a boundary of a side of the second sub-pixel strip 102 near the first sub-pixel strip 101 forms a second depression corresponding the second luminescent material confluence channel 1021, each of the at least two first sub-pixel 1011 is provided corresponds to the second depression of the second sub-pixel strip 102, and each of the at least two second sub-pixel 1021 is provided corresponds to the first depression of the first sub-pixel strip 101.

A width D of the display panel occupied by the first sub-pixel strip 101 and the second sub-pixel strip 102 staggered is less than sum of a width B1 of the display panel occupied by the first sub-pixel strip 101 and a width B2 of the display panel occupied the second sub-pixel strip 102.

It is worth noting that the corresponding pixel color in the embodiments is only an example, and the color can be adjusted according to different pixel requirements. For example, the blue sub-pixel in the embodiments can be replaced with a green sub-pixel, and the green sub-pixel can be replaced with a blue sub-pixel. Since the blue sub-pixel has a shorter lifetime than the red and green sub-pixels, if the third sub-pixel is designed as a blue sub-pixel, the aperture ratio and lifetime of the blue sub-pixel can be greatly improved, thereby improving the luminous efficiency of the panel.

In one embodiment, the pixel openings of the first sub-pixel 1011 and the second sub-pixel 1021 are trapezoidal, of course, they may be other shapes, such as triangles, semi-circles, etc., which is not limited herein.

Figure 4:
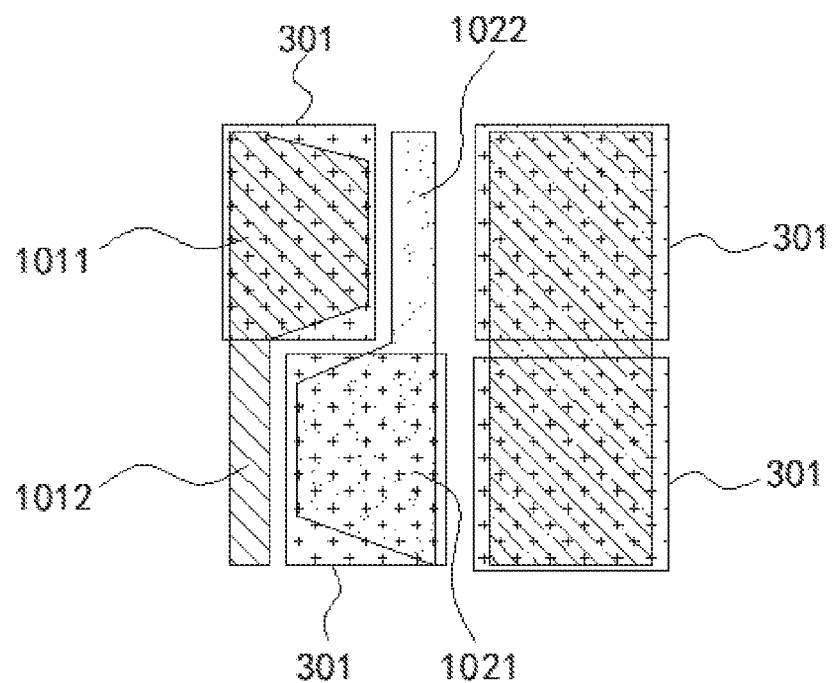
FIG. 4 is a schematic diagram of an anode of the display panel according to one embodiment of the present disclosure.

Referring to FIG. 4, the light-emitting device layer includes an anode 301, and each sub-pixel is correspondingly provided with an anode 301. In the pixel design of the present disclosure, the design of the anode 301 needs to avoid the luminescent material confluence channel, that is, an orthographic projection of an anode 301 of the first sub-pixel 1011 on the substrate spaced apart from an orthographic projection of the second luminescent material confluence channel 1022 of the second sub-pixel strip 102 on the substrate, and an orthographic projection of the an anode 301 of the second sub-pixel 1021 on the substrate spaced apart from an orthographic projection of the first luminescent material confluence channel 1012 of the first sub-pixel strip on the substrate.

Figure 6:
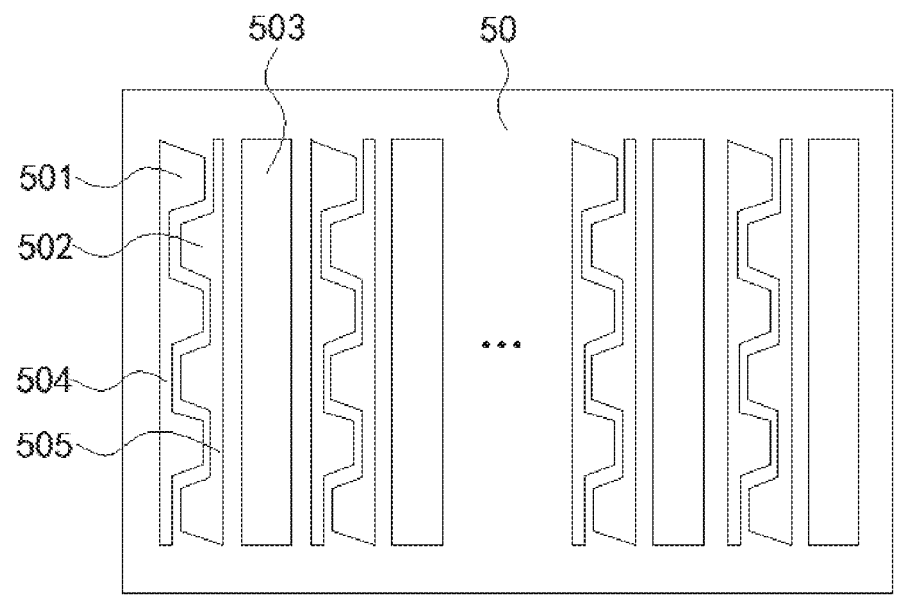
FIG. 6 is a schematic structural diagram of a pixel definition layer of the display panel according to one embodiment of the present disclosure.

Please refer to FIG. 5, the present disclosure also provides a method of manufacturing a display panel. The method includes the following steps:

Step S1, as shown in FIG. 6, a pixel definition layer 50 is provided on a base substrate, and patterning the pixel definition layer 50 to form at least two first sub-pixel holes 501, at least two second sub-pixel holes 502, and at least two third sub-pixels 503 which are sequentially arranged in a row/column direction, and forming a first luminescent material confluence channel 504 communicating with two adjacent first sub-pixel holes 501 and forming a second luminescent material confluence channel 505 communicating with two adjacent second sub-pixel holes 502 along the row/column.

An array driving layer is prepared on the base substrate, a patterned anode is prepared on the array driving layer, and the pixel definition layer 50 is prepared on the anode.

In this embodiment, the first sub-pixel holes 501, the second sub-pixel holes 502, the third sub-pixel holes 503, the first luminescent material confluence channel 504, and the second luminescent material confluence channel 505 is formed through the same photomask process.

In the step S1, after patterning the pixel definition layer 50, forming a first depression in a boundary of a side of a combination of the first sub-pixel holes 501 and the first luminescent material confluence channel 504 near the second sub-pixel holes 502. Forming a second depression in a boundary of a side of a combination of the second sub-pixel holes 502 and the second luminescent material confluence channel 505 near the first sub-pixel holes 501, wherein each of the first sub-pixel holes 501 is provided corresponds to a position of the second depression, each of the second sub-pixel holes is provided corresponds to a position of the first depression.

Figure 7:
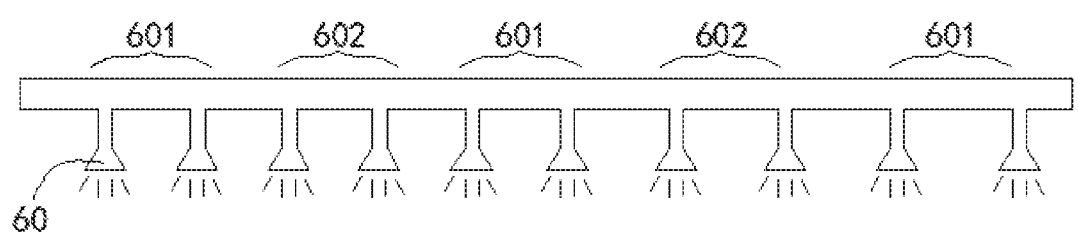
FIG. 7 is a schematic diagram of nozzles corresponding to a sub-pixel strip on a printing device according to one embodiment of the present disclosure.

Step S2, as shown in FIG. 6 and FIG. 7, sequentially arranging a plurality of nozzles 60 in the row/column direction with the at least two first sub-pixel holes 501, the at least two second sub-pixel holes 502, and the at least two third sub-pixel holes 503, and forming a luminescent material in a row/column linear manner including forming a first luminescent material in the at least two first sub-pixel holes 501 and the first luminescent material confluence channel 504, forming a second luminescent material in the at least two second sub-pixel holes 502 and the second luminescent material confluence channel 505, and forming a third luminescent material in the at least two third sub-pixel holes 503.

Please further refer the FIG. 6 and FIG. 7, wherein sequentially arranging a plurality of nozzles 60 in the row/column direction comprising a first group of nozzles 601 corresponding the first sub-pixel holes 501 or the second sub-pixel holes 502, and a second group of nozzles 502 corresponding the first luminescent material confluence channel 504 or the second luminescent material confluence channel 505. Among them, FIG. 7 only uses a nozzle corresponding to one sub-pixel strip as an example for description.

When the printing range of the plurality of nozzles 60 is larger than a width of the first luminescent material confluence channel 504 and a width of the second luminescent material confluence channel 505, the step S2 includes the following steps:

When the plurality of nozzles 60 moves to the first luminescent material confluence channel 504, turning on the first group of nozzles 601 and turning off the second group of nozzles 602, to form the first luminescent material in the first sub-pixel holes 501 and the first luminescent material confluence channel 504.

When the plurality of nozzles 60 moves to the second luminescent material confluence channel 505, turning on the first group of nozzles 601 and turning off the second group of nozzles 602, to form the second luminescent material in the at least two second sub-pixel holes 502 and the second luminescent material confluence channel 505.

When the plurality of nozzles 60 moves to the third sub-pixel holes 503, turning on the first group of nozzles 601 and the second group of nozzles 602, to form the third luminescent material in the third sub-pixel holes 503.

In the manufacturing method of the present disclosure, if the printing of the nozzle 60 requires a minimum width greater than the width of the luminescent material confluence channel between the sub-pixels, the printing nozzle 60 at the position of the non-pixel opening area, that is, the luminescent material confluence channel, needs to be turned off, to avoid color mixing.

When the printing range of the plurality of nozzles 60 is smaller than or equal to a width of the first luminescent material confluence channel 504 and a width of the second luminescent material confluence channel 505, turning on all the nozzles of the first group of nozzles 601 and the second group of nozzles 602 in step S2. While achieving line printing of luminescent materials, it is conducive to the flow of luminescent materials in different positions of the same color, and can speed up the printing speed of luminescent materials and shorten the process time.

It can be understood that the printing range of the nozzle 60 does not affect the third sub-pixel hole, that is, when printing the third luminescent material in the third sub-pixel holes, the first group of nozzles 601 and the second group of nozzles 602 can all be turned on.

Step S3, forming a cathode layer on the luminescent material.

Step S4, forming a thin-film encapsulation layer on the cathode layer.

In summary, the display panel and the manufacturing method thereof provided by the present disclosure, arranging the sub-pixels of the same color along rows/columns, while achieving linear printing the luminescent material, due to the adjacent two sub-pixels are connected through the luminescent material confluence channel, therefore, the luminescent materials printed to different positions of the same sub-pixel strip can flow with each other, thereby improving the flatness of the luminescent material printing and the uniformity of the OLED device. In addition, the pixel arrangement of the present disclosure can increase the pixel density, thereby achieving high resolution of the display panel.

In summary, although the present disclosure has been disclosed above with preferred embodiments, the above preferred embodiments are not intended to limit the present disclosure. Those skilled in the art can make various modifications and retouching without departing from the spirit and scope of the present disclosure, therefore, the protection scope of the present disclosure is based on the scope defined by the claims.

What is claimed is:

1. A display panel, comprising:
   a substrate;
   an array driving layer disposed on the substrate;
   a light-emitting device layer disposed on the array driving layer;
   a thin-film encapsulation layer disposed on the light-emitting device layer; and
   a first sub-pixel strip, a second sub-pixel strip, and a third sub-pixel strip sequentially arranged in a row direction or a column direction;
   wherein the first sub-pixel strip comprises at least two first sub-pixels and a first luminescent material confluence channel connected between the two first sub-pixels which are distributed along a direction of the first sub-pixel strip, the second sub-pixel strip comprises at least two second sub-pixels and a second luminescent material confluence channel connected between the two second sub-pixels which are distributed along a direction of the second sub-pixel strip, and the third sub-pixel strip comprises at least two third sub-pixels connected to each other and arranged side by side along a direction of the third sub-pixel strip, wherein the first sub-pixels emit light of a color different from that of light emitted by the second sub-pixels, and the third sub-pixels emit light of a color different from that of the light emitted by the first sub-pixels;
   wherein the first sub-pixels on the first sub-pixel strip and the second sub-pixels on the second sub-pixel strip are staggered, one of the first sub-pixels and one of the third sub-pixels arranged in a same row constitute a first pixel unit such that the second luminescent material confluence channel is located between the one of the first sub-pixels and the one of the third sub-pixels, and one of the second sub-pixels and one of the third sub-pixels arranged in a same row constitute a second pixel unit such that the one of the second sub-pixels is located between the first luminescent material confluence channel and the one of the third sub-pixels;
   wherein a pixel opening area of each of the third sub-pixels is larger than a pixel opening area of the first sub-pixel in the first pixel unit or is larger than a pixel opening area of the second sub-pixel in the second pixel unit.

2. The display panel as claimed in claim 1, wherein the pixel opening area of each of the first sub-pixels is equal to the pixel opening area of each of the second sub-pixels.

3. The display panel as claimed in claim 2, wherein a pixel opening width of each of the first sub-pixels perpendicular to the direction of the first sub-pixel strip and a pixel opening width of each of the second sub-pixels perpendicular to the direction of the second sub-pixel strip are equal to each other, and are both less than a pixel opening width of the third sub-pixel perpendicular to the direction of third sub-pixel stripe.

4. The display panel as claimed in claim 1, wherein a width of the display panel occupied by the first sub-pixel strip and the second sub-pixel strip staggered is less than sum of a width of the display panel occupied by the first sub-pixel strip and a width of the display panel occupied the second sub-pixel strip.

5. The display panel as claimed in claim 1, wherein in a direction perpendicular to the direction of the first sub-pixel strip, a width of the first luminescent material confluence channel is less than a pixel opening width of the first sub-pixel; and in a direction perpendicular to the direction of the second sub-pixel strip, a width of the second luminescent material confluence channel is less than a pixel opening width of the second sub-pixel.

6. The display panel as claimed in claim 5, wherein a boundary of a side of the first sub-pixel strip near the second sub-pixel strip forms a first depression corresponding the first luminescent material confluence channel, a boundary of a side of the second sub-pixel strip near the first sub-pixel strip forms a second depression corresponding the second luminescent material confluence channel, each of the at least two first sub-pixel is provided corresponds to the second depression of the second sub-pixel strip, and each of the at least two second sub-pixel is provided corresponds to the first depression of the first sub-pixel strip.

7. The display panel as claimed in claim 6, wherein the light-emitting device layer comprises a plurality of anodes, an orthographic projection of an anode of the first sub-pixel on the substrate spaced apart from an orthographic projection of the second luminescent material confluence channel of the second sub-pixel strip on the substrate, and an orthographic projection of the an anode of the second sub-pixel on the substrate spaced apart from an orthographic projection of the first luminescent material confluence channel of the first sub-pixel strip on the substrate.

8. A method of manufacturing a display panel, wherein the method comprises the following steps:
  step S1, a pixel definition layer is provided on a base substrate, and patterning the pixel definition layer to form at least two first sub-pixel holes, at least two second sub-pixel holes, and at least two third sub-pixel holes which are sequentially arranged in a row/column direction, and forming a first luminescent material confluence channel connected between two adjacent first sub-pixel holes and forming a second luminescent material confluence channel connected between two adjacent second sub-pixel holes along the row/column, wherein the third sub-pixel holes are formed side by side;
  step S2, sequentially arranging a plurality of nozzles in the row/column direction with the at least two first sub-pixel holes, the at least two second sub-pixel holes, and the at least two third sub-pixel holes, and forming a luminescent material in a row/column linear manner including forming a first luminescent material in the at least two first sub-pixel holes and the first luminescent material confluence channel, forming a second luminescent material in the at least two second sub-pixel holes and the second luminescent material confluence channel, and forming a third luminescent material in the at least two third sub-pixel holes, wherein the first luminescent material in one of the first sub-pixel holes and the third luminescent material in one of the third sub-pixel holes arranged in a same row constitute a first pixel unit such that the second luminescent material confluence channel is located between the one of the first sub-pixel holes and the one of the third sub-pixel holes, and wherein the second luminescent material in one of the second sub-pixel holes and the third luminescent material in one of the third sub-pixel holes arranged in a same row constitute a second pixel unit such that the one of the second sub-pixel holes is located between the first luminescent material confluence channel and the one of the third sub-pixel holes;
  step S3: forming a cathode layer on the luminescent material; and
  step S4, forming a thin-film encapsulation layer on the cathode layer;
  wherein an area of each of the third sub-pixel holes is larger than an area of each of the first sub-pixel holes or is larger than an area of each of the second sub-pixel holes.

9. The method as claimed in claim 8, wherein in the step S1, after patterning the pixel definition layer, forming a first depression in a boundary of a side of a combination of the first sub-pixel holes and the first luminescent material confluence channel near the second sub-pixel holes, forming a second depression in a boundary of a side of a combination of the second sub-pixel holes and the second luminescent material confluence channel near the first sub-pixel holes, wherein each of the first sub-pixel holes is provided corresponds to a position of the second depression, each of the second sub-pixel holes is provided corresponds to a position of the first depression.

10. The method as claimed in claim 8, wherein sequentially arranging a plurality of nozzles in the row/column direction comprising a first group of nozzles corresponding the first sub-pixel holes or the second sub-pixel holes, and a second group of nozzles corresponding the first luminescent material confluence channel or the second luminescent material confluence channel.

11. The method as claimed in claim 10, wherein when the printing range of the plurality of nozzles is larger than a width of the first luminescent material confluence channel and a width of the second luminescent material confluence channel, the step S2 comprises the following steps:
  when the plurality of nozzles moves to the first luminescent material confluence channel, turning on the first group of nozzles and turning off the second group of nozzles, to form the first luminescent material in the first sub-pixel holes and the first luminescent material confluence channel;
  when the plurality of nozzles moves to the second luminescent material confluence channel, turning on the first group of nozzles and turning off the second group of nozzles, to form the second luminescent material in the at least two second sub-pixel holes and the second luminescent material confluence channel;
  when the plurality of nozzles moves to the third sub-pixel holes, turning on the first group of nozzles and the second group of nozzles, to form the third luminescent material in the third sub-pixel holes.

12. The method as claimed in claim 10, wherein the printing range of the plurality of nozzles is smaller than or equal to a width of the first luminescent material confluence channel and a width of the second luminescent material confluence channel, turning on all the nozzles of the first group of nozzles and the second group of nozzles in step S2.

* * * * *